United States Patent
Guenther et al.

(10) Patent No.: US 7,674,338 B2
(45) Date of Patent: Mar. 9, 2010

(54) HEATED SUBSTRATE SUPPORT AND METHOD OF FABRICATING SAME

(75) Inventors: Rolf A. Guenther, Monte Sereno, CA (US); Curtis B. Hammill, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 910 days.

(21) Appl. No.: 11/115,575

(22) Filed: Apr. 26, 2005

(65) Prior Publication Data

US 2006/0075971 A1 Apr. 13, 2006

Related U.S. Application Data

(63) Continuation-in-part of application No. 10/965,601, filed on Oct. 13, 2004, now abandoned.

(51) Int. Cl.
*C23F 1/00* (2006.01)
(52) U.S. Cl. .................................................. 118/725
(58) Field of Classification Search ............... 118/725, 118/728; 156/345.52; 219/638, 97, 209, 219/407, 406, 415, 444.1, 451.1, 452.11, 219/452.12, 468.2, 461.1, 481; 338/285; 427/248.1
See application file for complete search history.

(56) References Cited

U.S. PATENT DOCUMENTS

| | | | | |
|---|---|---|---|---|
| 1,087,198 | A * | 2/1914 | Steward | ............ 219/538 |
| 2,222,192 | A * | 11/1940 | Arnold et al. | ............ 38/82 |
| 2,389,588 | A * | 11/1945 | Woodman | ............ 219/530 |
| 2,541,118 | A * | 2/1951 | Sparklin et al. | ............ 219/254 |
| 5,104,459 | A * | 4/1992 | Chen et al. | ............ 148/552 |
| 5,844,205 | A | 12/1998 | White et al. | |
| 6,035,101 | A | 3/2000 | Sajoto et al. | |
| 6,087,632 | A | 7/2000 | Mizosaki et al. | |
| 6,180,931 | B1 * | 1/2001 | Futakuchiya et al. | ...... 219/544 |
| 6,371,357 | B1 | 4/2002 | Watanabe | |
| 6,376,815 | B1 | 4/2002 | Watanabe | |
| 6,477,980 | B1 | 11/2002 | White et al. | |
| 6,500,356 | B2 | 12/2002 | Goto et al. | |
| 6,552,311 | B2 | 4/2003 | Watanabe | |
| 6,557,747 | B2 * | 5/2003 | Watanabe | ............ 228/174 |
| 6,660,975 | B2 | 12/2003 | Wang et al. | |
| 6,897,411 | B2 * | 5/2005 | Beer et al. | ............ 219/390 |
| 7,154,070 | B2 * | 12/2006 | Watanabe et al. | ...... 219/444.1 |

FOREIGN PATENT DOCUMENTS

KR 20040075178 8/2004
TW 438903 6/2001

OTHER PUBLICATIONS

Office Action Dated Jul. 17, 2007, from Taiwanese Patent Office on Application No. 94128097.

* cited by examiner

*Primary Examiner*—Michael Cleveland
*Assistant Examiner*—Tabassom Tadayyon Eslami
(74) *Attorney, Agent, or Firm*—Patterson & Sheridan

(57) ABSTRACT

A method and apparatus for forming a substrate support is provided herein. In one embodiment, the substrate support includes a body having a support surface and at least one groove. A heater element surrounded with a malleable heat sink is disposed in the groove. The heat sink may be comprised of one or more parts. A cap is disposed in the groove above the heat sink and has an upper surface disposed substantially flush with the support surface.

19 Claims, 10 Drawing Sheets

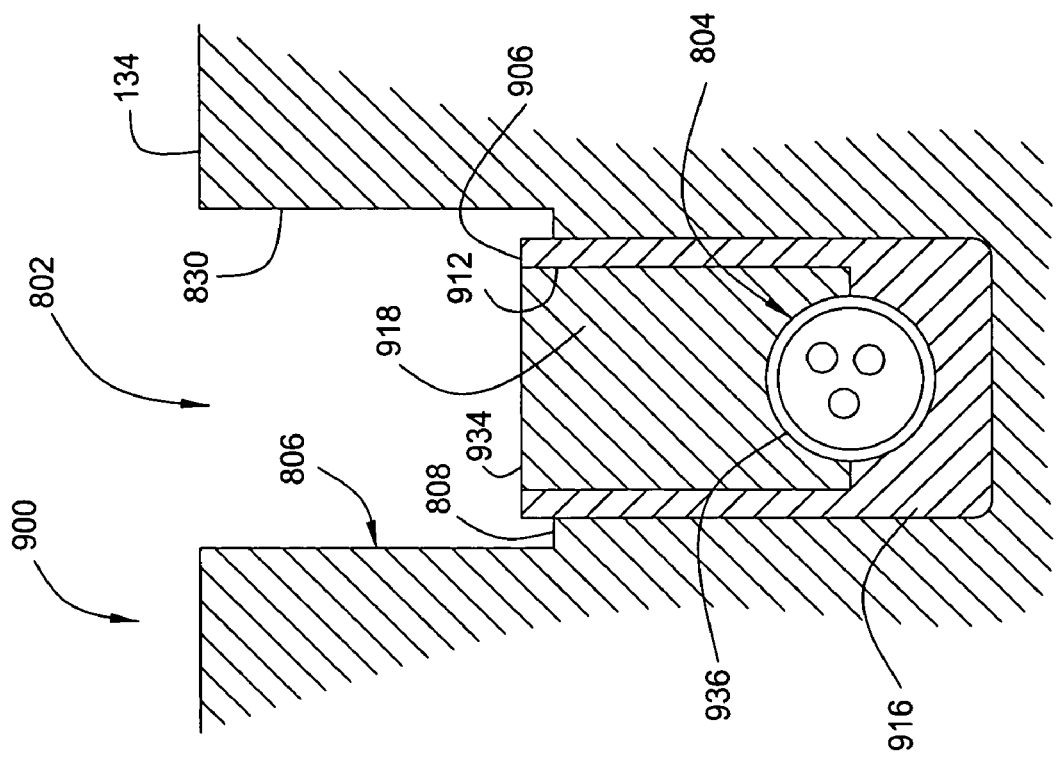
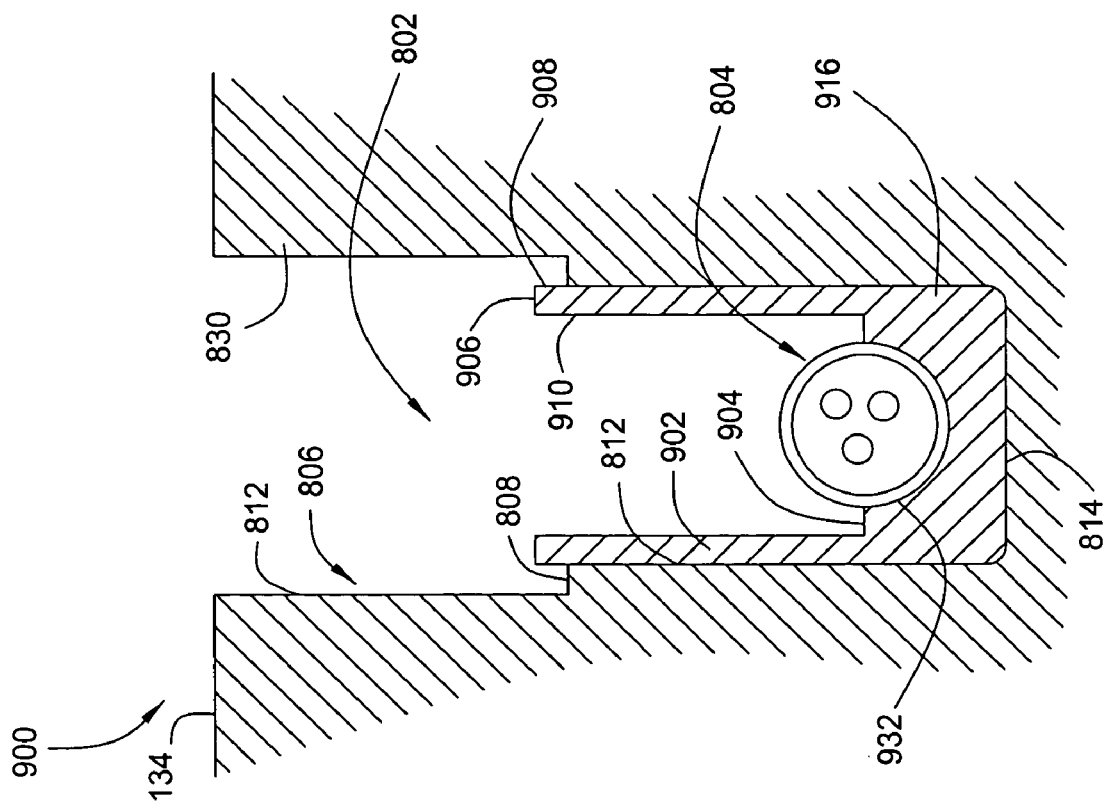

HEATED SUBSTRATE SUPPORT AND METHOD OF FABRICATING SAME

CROSS-REFERENCE TO RELATED APPLICATION

This application is a continuation-in-part of U.S. patent application Ser. No. 10/965,601 now abandoned, filed Oct. 13, 2004, which is herein incorporated by reference in its entirety.

BACKGROUND OF THE INVENTION

1. Field of the Invention

Embodiments of the invention generally provide a substrate support utilized in substrate processing and a method of fabricating the same.

2. Description of the Related Art

Liquid crystal displays or flat panels are commonly used for active matrix displays such as computer and television monitors. Generally, flat panels comprise two glass plates having a layer of liquid crystal material sandwiched therebetween. At least one of the glass plates includes at least one conductive film disposed thereon that is coupled to a power supply. Power supplied to the conductive film from the power supply changes the orientation of the crystal material, creating a pattern such as text or graphics that can be seen on the display. One fabrication process frequently used to produce flat panels is plasma enhanced chemical vapor deposition (PECVD).

Plasma enhanced chemical vapor deposition is generally employed to deposit thin films on a substrate such as a silicon or quartz wafer, large area glass or polymer workpiece, and the like. Plasma enhanced chemical vapor deposition is generally accomplished by introducing a precursor gas into a vacuum chamber that contains the substrate. The precursor gas is typically directed through a distribution plate situated near the top of the chamber. The precursor gas in the chamber is energized (e.g., excited) into a plasma by applying RF power to the chamber from one or more RF sources coupled to the chamber. The excited gas reacts to form a layer of material on a surface of the substrate that is positioned on a temperature controlled substrate support. In applications where the substrate receives a layer of low temperature polysilicon, the substrate support may be heated in excess of 400 degrees Celsius. Volatile by-products produced during the reaction are pumped from the chamber through an exhaust system.

Generally, the substrate support utilized to process flat panel displays are large, most often exceeding 550 mm×650 mm. The substrate supports for high temperature use are typically forged or welded, encapsulating one or more heating elements and thermocouples in an aluminum body. The substrate supports typically operate at elevated temperatures (i.e., in excess of 350 degrees Celsius and approaching 500 degrees Celsius). Due to these high operating temperatures, the heating elements encapsulated in the substrate supports are susceptible to failure due to local hot spots that may form if the heat is not properly carried away and distributed throughout the substrate support.

Although substrate supports configured in this manner have demonstrated good processing performance, manufacturing such supports has proven difficult and expensive. Moreover, as the cost of materials and manufacturing the substrate support is great, failure of the substrate support is highly undesirable. Additionally, if the substrate support fails during processing, a substrate supported thereon may be damaged. As this may occur after a substantial number of processing steps have been preformed thereon, the resulting loss of the in-process substrate may be very expensive. Furthermore, replacing a damaged support in the process chamber creates a costly loss of substrate throughput while the process chamber is idled during replacement or repair of the substrate support. Moreover, as the size of the next generation substrate supports are increased to accommodate substrates in excess of 2 square meters at operating temperatures approaching 500 degrees Celsius, the aforementioned problems become increasingly more important to resolve.

Therefore, there is a need for an improved substrate support.

SUMMARY OF THE INVENTION

Embodiments of a heated substrate support are provided herein. In one embodiment, the substrate support includes a body having a support surface and at least one groove. A heater element clad with a malleable heat sink is disposed in the groove. Substantially no air is trapped between the clad heater element and the groove. An insert is disposed in the groove above the heater element. The insert substantially covers and contacts the clad heater element and the sides of the groove. A cap is disposed in the groove above the insert. The cap covers and contacts the insert and has an upper surface disposed substantially flush with the support surface.

In another embodiment, the substrate support includes a body having a support surface and at least one groove. A heater element surrounded with a malleable heat sink is disposed in the groove. The heat sink may be comprised of one or more parts. A cap is disposed in the groove above the heat sink and has an upper surface disposed substantially flush with the support surface.

In another embodiment, a method of forming a substrate support is provided. The method of forming the substrate support includes the steps of providing a body having at least one groove formed in an upper support surface thereof, and inserting a heater element surrounded with a heat sink material softer than the body into the groove. The heat sink may comprise one or more parts. A cap is disposed in the groove over the heater element and heat sink. An upper surface of the cap is made substantially flush with the upper support surface of the body.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 9A-E are partial cross-sectional views of another substrate support in different stages of fabrication.

To facilitate understanding, identical reference numerals have been used, wherever possible, to designate identical elements that are common to the figures.

DETAILED DESCRIPTION

The invention generally provides a heated substrate support and methods of fabricating the same. The invention is illustratively described below in reference to a PECVD system, such as a PECVD system available from AKT, a division of Applied Materials, Inc., located in Santa Clara, Calif. However, it should be understood that the invention has utility in other system configurations such as physical vapor deposition systems, ion implant systems, etch systems, other chemical vapor deposition systems and other systems in which use of a heated substrate support is desired.

Figure 1:
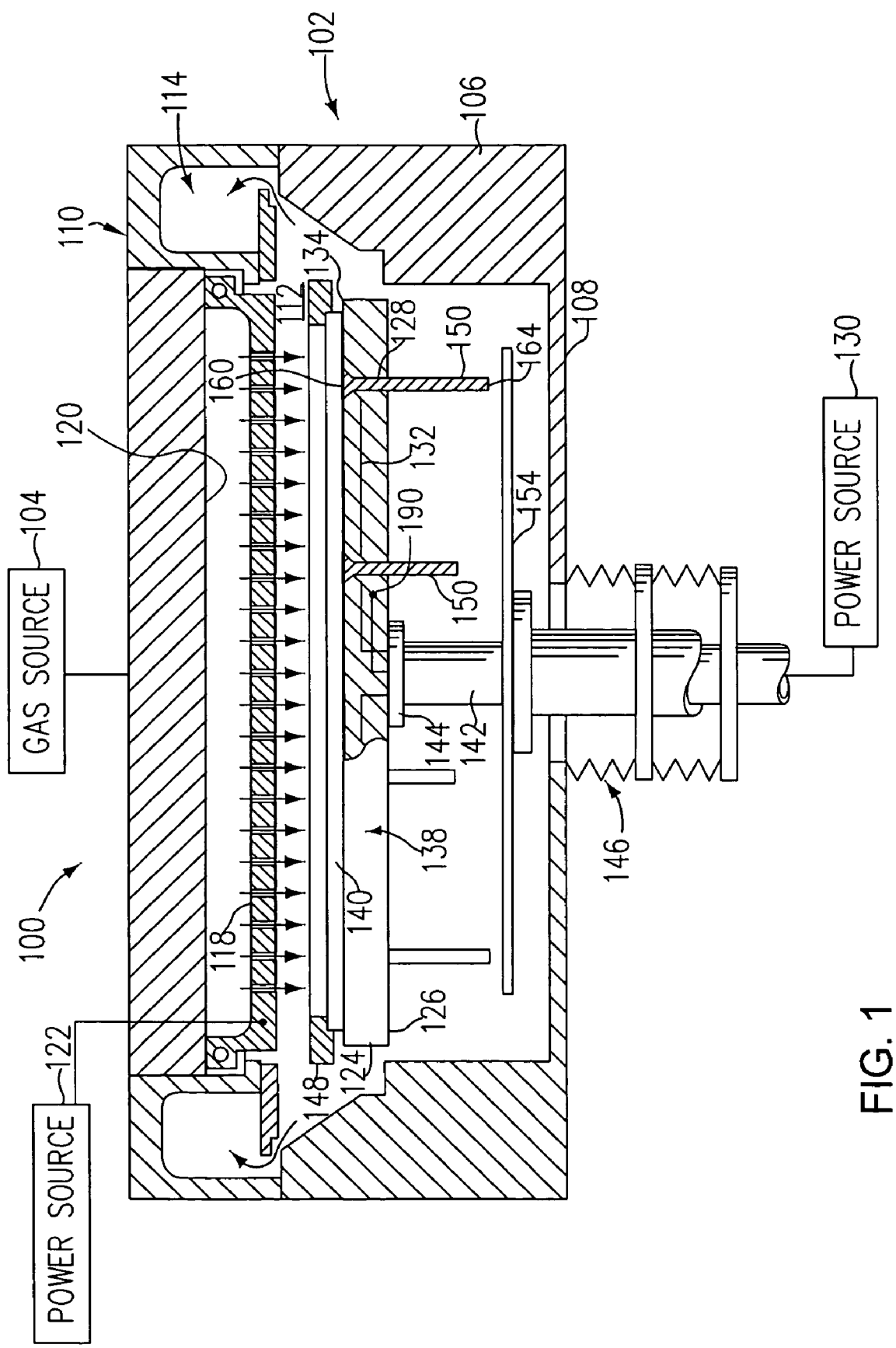
FIG. 1 is a schematic sectional view of one embodiment of a processing chamber having a substrate support of the present invention.

FIG. 1 is a cross sectional view of one embodiment of a plasma enhanced chemical vapor deposition system 100. The system 100 generally includes a chamber 102 coupled to a gas source 104. The chamber 102 has walls 106, a bottom 108, and a lid assembly 110 that define a process volume 112. The process volume 112 is typically accessed through a port (not shown) in the walls 106 that facilitates movement of the substrate 140 into and out of the chamber 102. The walls 106 and bottom 108 are typically fabricated from a unitary block of aluminum or other material compatible for processing. The lid assembly 110 contains a pumping plenum 114 that couples the process volume 112 to an exhaust port (that includes various pumping components, not shown).

The lid assembly 110 is supported by the walls 106 and can be removed to service the chamber 102. The lid assembly 110 is generally comprised of aluminum. A distribution plate 118 is coupled to an interior side 120 of the lid assembly 110. The distribution plate 118 is typically fabricated from aluminum. The center section includes a perforated area through which process and other gases supplied from the gas source 104 are delivered to the process volume 112. The perforated area of the distribution plate 118 is configured to provide uniform distribution of gases passing through the distribution plate 118 into the chamber 102.

A heated substrate support assembly 138 is centrally disposed within the chamber 102. The support assembly 138 supports a substrate 140 during processing. In one embodiment, the substrate support assembly 138 comprises an aluminum body 124 that encapsulates at least one embedded heating element 132 and a thermocouple 190. The body 124 may optionally be coated or anodized. Alternatively, the body 124 may be made of ceramics or other materials compatible with the processing environment.

The heating element 132, such as an electrode disposed in the support assembly 138, is coupled to a power source 130 and controllably heats the support assembly 138 and substrate 140 positioned thereon to a predetermined temperature. Typically, the heating element 132 maintains the substrate 140 at a uniform temperature of from about 150 to at least about 460 degrees Celsius.

Generally, the support assembly 138 has a lower side 126 and an upper surface 134 that supports the substrate. In one embodiment, the upper support surface 134 is configured to support a substrate greater than or equal to about 550 by about 650 millimeters. In one embodiment, the upper support surface 134 has a plan area greater than or equal to about 0.35 square meters for supporting substrates having a size greater than or equal to about 550 by 650 millimeters. In one embodiment, the upper support surface 134 has a plan area of greater than or equal to about 2.7 square meters (for supporting substrates having a size greater than or equal to about 1500 by 1800 millimeters). The upper support surface 134 may generally have any shape or configuration. In one embodiment, the upper support surface 134 has a substantially polygonal shape. In one embodiment, the upper support surface is a quadrilateral.

The lower side 126 has a stem cover 144 coupled thereto. The stem cover 144 generally is an aluminum ring coupled to the support assembly 138 that provides a mounting surface for the attachment of a stem 142 thereto. Generally, the stem 142 extends from the stem cover 144 and couples the support assembly 138 to a lift system (not shown) that moves the support assembly 138 between an elevated position (as shown) and a lowered position. A bellows 146 provides a vacuum seal between the chamber volume 112 and the atmosphere outside the chamber 102 while facilitating the movement of the support assembly 138. The stem 142 additionally provides a conduit for electrical and thermocouple leads between the support assembly 138 and other components of the system 100.

The support assembly 138 has a plurality of holes 128 disposed therethrough that accept a plurality of lift pins 150. The lift pins 150 are typically comprised of ceramic or anodized aluminum. Generally, the lift pins 150 have first ends 160 that are substantially flush with or slightly recessed from an upper surface 134 of the support assembly 138 when the lift pins 150 are in a normal position (i.e., retracted relative to the support assembly 138). The first ends 160 are generally flared to prevent the lift pins 150 from falling through the holes 128. A second end 164 of the lift pins 150 extends beyond the lower side 126 of the support assembly 138. The lift pins 150 may be displaced relative to the support assembly 138 by a lift plate 154 to project from the support surface 134, thereby placing the substrate in a spaced-apart relation to the support assembly 138.

The support assembly 138 generally is grounded such that RF power supplied by a power source 122 to the distribution plate 118 (or other electrode positioned within or near the lid assembly of the chamber) may excite the gases disposed in the process volume 112 between the support assembly 138 and the distribution plate 118. The RF power from the power source 122 is generally selected commensurate with the size of the substrate to drive the chemical vapor deposition process.

The support assembly 138 additionally supports a circumscribing shadow frame 148. Generally, the shadow frame 148 prevents deposition at the edge of the substrate 140 and support assembly 138 so that the substrate does not stick to the support assembly 138.

Figure 2:
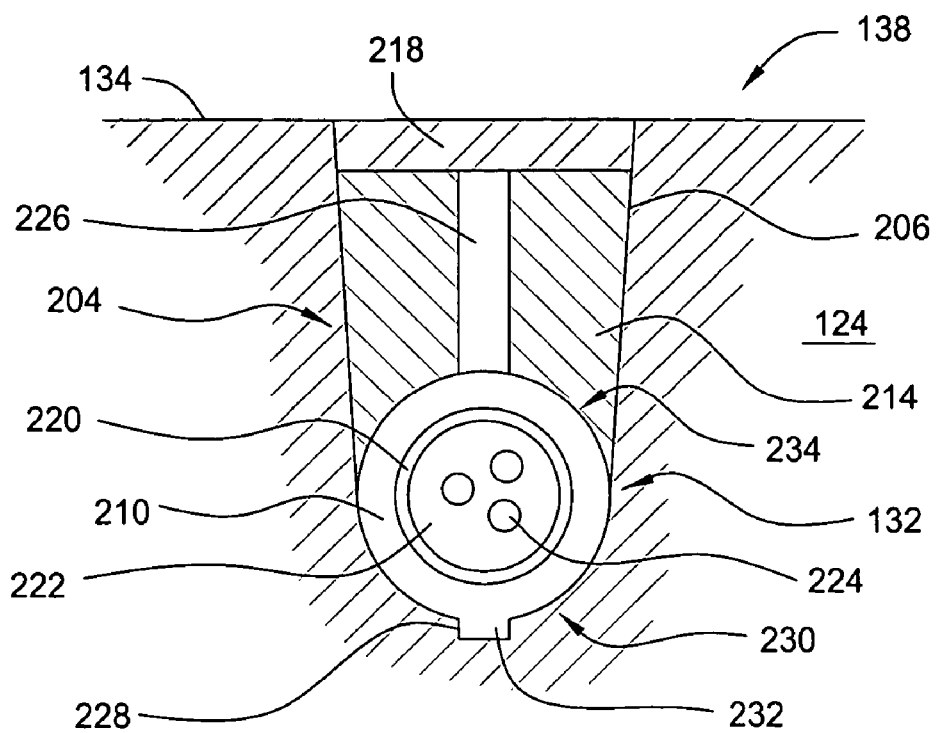
FIG. 2 is a partial cross-sectional view of one embodiment of the substrate support assembly of FIG. 1.

FIG. 2 depicts a partial cross-sectional view of the heater element 132 disposed in a groove 204 formed in the substrate support assembly 138. The heater element 132 generally includes a plurality of conductive elements 224 encased in a dielectric 222 and covered with a protective sheath 220. The heater element 132 further includes a cladding 210 which surrounds the sheath 220. The cladding 210 forms an integral bond with the sheath 220, having substantially no air pockets trapped between the cladding 210 and the sheath 220. In one embodiment, the heater element 132 may be clad by tightly wrapping a conformable sheet of the cladding 210 around the sheath 220. Alternatively, the cladding 210 may be formed of a larger diameter tubing than the sheath 220, which is then drawn through a die and swaged around the sheath 220 of the heater element 132. It is contemplated that the heater element 132 may also comprise a conduit (not shown) for flowing a heat transfer fluid therethrough having the cladding 210 circumscribing the conduit.

Generally, the cladding 210 has good thermal conductivity and is thick enough to be a heat sink at high heating rates to substantially prevent hot spots on the heater element 132 during operation. As such, the cladding 210 generally may comprise any material with high thermal conductivity such that the cladding 210 is a sink for the heat produced by the conductive elements 224 during operation. The thickness of the cladding 210 required for a given application may be computed based upon the required heat load of the heater element 132. The cladding 210 is also generally softer, or more malleable, than the body 124 of the substrate support assembly 138 to prevent deformation of the groove 204 upon insertion of the heater element 132. In one embodiment, the cladding 210 may be made from a high purity, super plastic aluminum material, such as aluminum 1100 up to about aluminum 3000-100 series. In another embodiment, the cladding 210 may be made from any 1XXX series of materials that easily accepts cold or hot working, where X is an integer. The cladding 210 may be fully annealed. In one embodiment, the cladding 210 is formed from aluminum 1100-O. In another embodiment, the cladding 210 is formed from aluminum 3004.

The heater element 132 is disposed in the groove 204, or multiple grooves, formed in an upper surface 134 of the substrate support assembly 138. Alternatively, the grooves 204 for receiving the heater element 132 may be formed in the lower side 126 of the substrate support. The groove 204 has walls 206 and a bottom 230 that are generally not held to tight tolerances during fabrication. The groove 204 may be formed in the body 124 of the substrate support assembly 138 in any number, size, or pattern as required to produce a desired heat distribution profile utilizing the heater element 132. The groove 204 is generally deep enough such that the heater element 132 is positioned in a desired location upon insertion into the groove 204 and the depth may vary depending upon the application. In one embodiment, the depth of the groove 204 is calculated such that the heater element 132 is substantially centered in the body 124 of the substrate support assembly 138.

Figure 4:
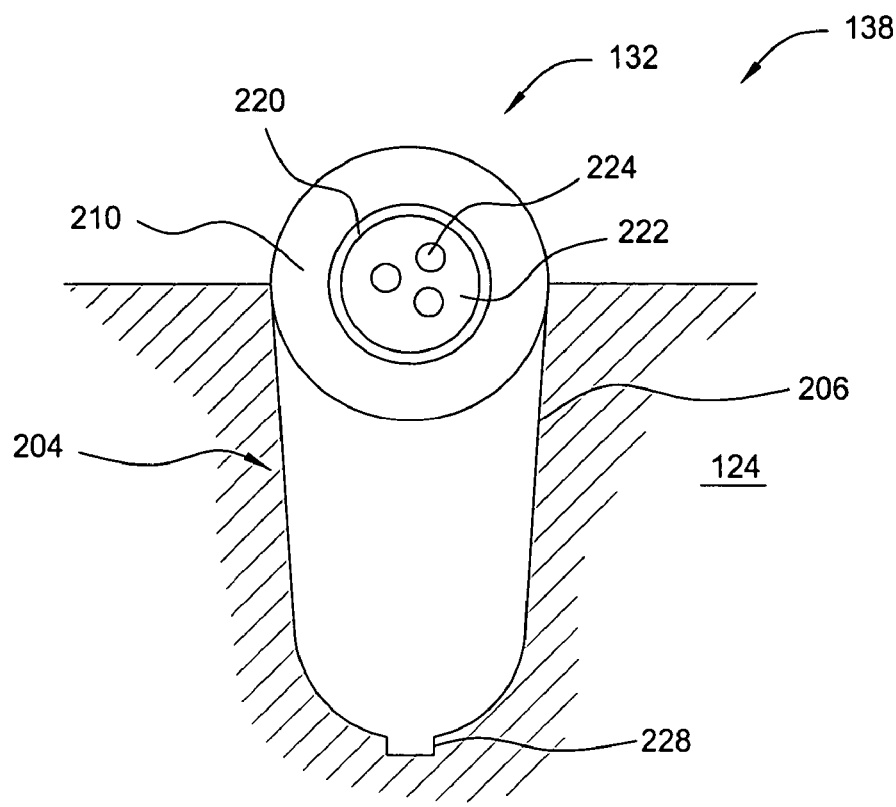
FIGS. 4-7 are partial cross-sectional views of a substrate support assembly in different stages of fabrication as described by the method of FIG. 3.

In one embodiment, the groove 204 is wider in diameter than the sheath 220 of the heater element 132 but narrower than the diameter of the cladding 210 prior to insertion, as depicted in FIG. 4. The heater element 132 is press-fit into the groove 204 such that the malleable cladding 210 deforms upon insertion into the groove 204 and disrupt the native oxide layers, thereby providing integral contact between the heater element 132 and the groove 204. As the groove 204 is wider than the diameter of the sheath 220, the conductive elements 224 and the dielectric 222 will remain undamaged by the insertion of the heater element 132 into the groove 204.

The walls 206 of the groove 204 may be substantially straight and parallel. Optionally, the walls 206 of the groove 204 may be formed at a slight angle or taper, such that the bottom 230 of the groove 204 is slightly narrower than the top portion of the groove 204. The angle of taper between the walls 206 is generally less than 3 degrees, although larger taper angles are also contemplated. The tapered walls 206 advantageously allows for easier insertion of the heater element 132, while still being narrow enough proximate the bottom 230 of the groove 204 to work the cladding 210 and the body 124 to form integral contact therebetween.

The bottom 230 of the groove 204 may be radiused to conform with the shape of the heater element 132. Alternatively, or in combination, the bottom 230 of the groove 204 may be roughened, or textured, to facilitate forming a more tightly interlocking seal or bond between the cladding 210 of the heater element 132 and the body 124 of the substrate support assembly 138. The textured surface further prevents movement between the heater element 132 and the body 124 of the substrate support assembly 138.

A channel 228 may also be provided in the bottom 230 of the groove 204. The channel 228 allows air to escape during insertion of the heating element 132 and further interlocks the heater element 132 and the groove 204. Upon insertion of the heater element 132 in the groove 204, a portion 232 of the cladding 210 deforms to fill the channel 228 to be in complete, integral contact with the body 124 of the substrate support assembly 138. Substantially no air pockets remain trapped between the cladding 210 and the groove 204, further enhancing heat transfer from the heater element 138 to the body 124 of the substrate support assembly 138. Optionally, prior to inserting the heater element 132, the groove 204 may be cleaned to remove any native oxide that may be present on the exposed surfaces of the groove 204. For example, the oxide layer may be abraded, etched with a caustic material, or removed by coating the exposed surfaces of the groove 204 with a sub-micron thick inhibitor layer prior to insertion of the heater element 132.

Figure 6:
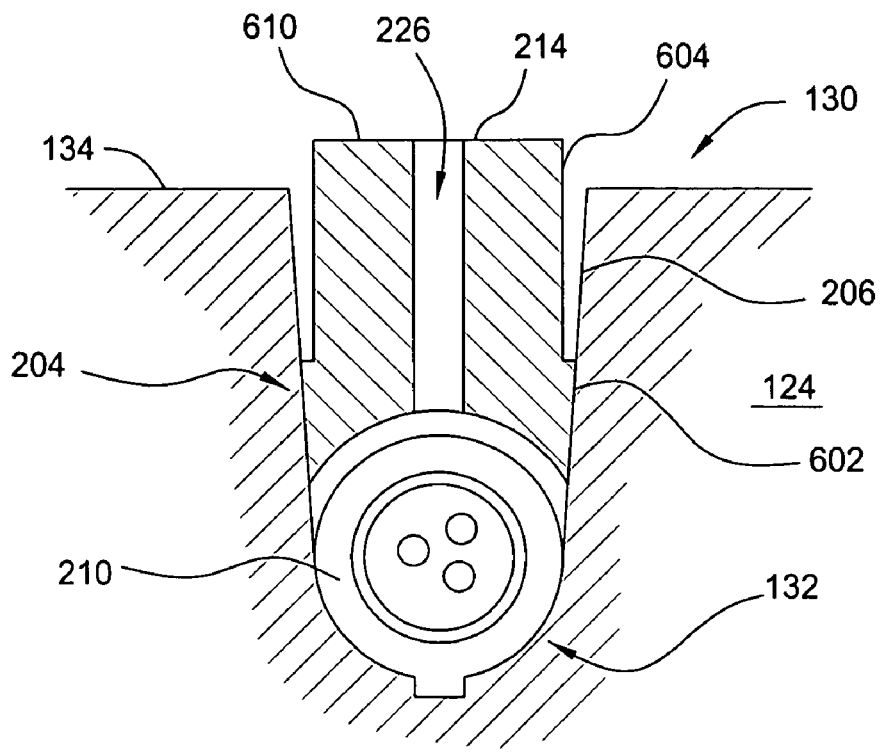
Figure 7:
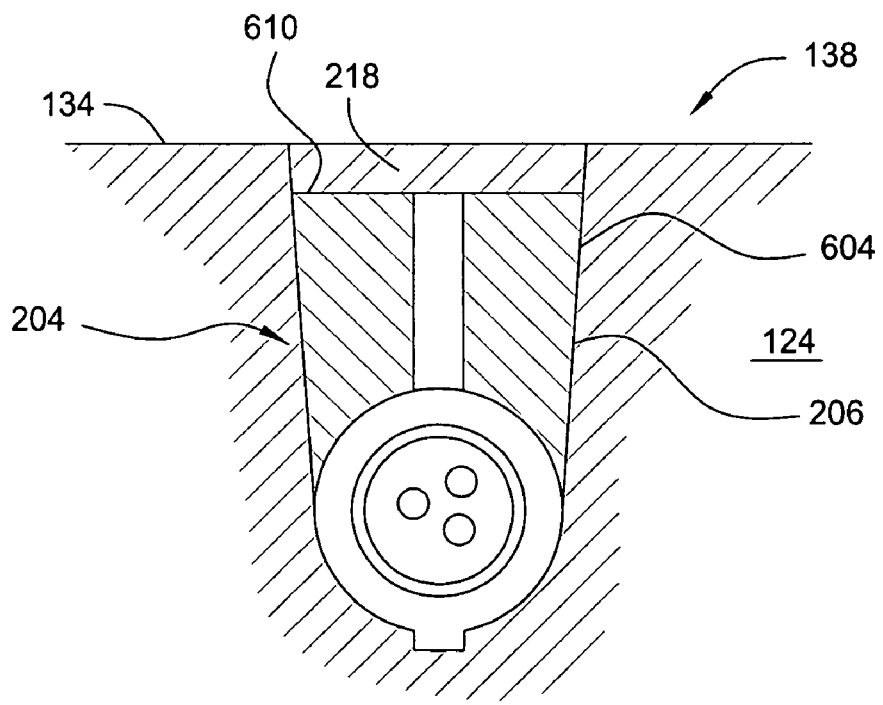

An insert 214 is disposed in the groove 204 above the heater element 132 and in close contact with the cladding 210 and the body 124 of the substrate support assembly 138. The insert 214 is generally made of the same materials as the cladding 210 and further improves the heat transfer away from the heater element 132. A bottom portion 234 of the insert 214 may be curved or otherwise shaped to conform more uniformly with the upper surface of the cladding 210 of the heating element 132. A plurality of air escape holes 226 may be formed in the insert 214 to allow air to escape from between the bottom portion 234 of the insert 214 and the heating element 132 during fabrication to further ensure integral contact between the insert 214 and the cladding 210 of the heating element 132. In one embodiment, as depicted in FIG. 6, the insert 214 has a lower portion 602 in contact with the walls 206 of the groove 204 and an upper portion 604 which is slightly relieved and not in contact with the walls 206. For example, the upper portion 604 may be relieved by several thousands of an inch. The reduced surface contact between the insert 214 and the walls 206 of the groove 204 facilitates easier insertion of the insert 214 into the groove 204. The relief is removed when the insert 214 is peened, rolled, pressed, or forged into the groove 204. The softness of the material of the insert 214 allows this process to occur without substantial yielding of the material of the body 124. After insertion into the groove 204, the insert 214 may be machined back to provide a true surface for a cap 218 that covers the insert 214.

The cap 218 covers the insert 214 and is disposed substantially flush with the upper surface 134 of the substrate support assembly 138. The cap 218 may comprise the same materials as the body 124 and is generally affixed to the walls 206 of the groove 204 to secure it in place. In one embodiment, the cap 218 may be welded to the body 124. Alternatively, the cap 218 may be forged in place. It is contemplated that other methods of affixation of the cap 218 to the body 124 of the substrate support assembly 138 may be utilized equally as well as long as the union between the cap 218 and body 124 can withstand the processing conditions that the substrate support assembly 138 is subjected to. Optionally, the cap 218 and/or the body 124 may be machined coplanar to provide a smooth upper surface 134 for supporting a substrate thereon. The substrate support assembly 138 may also be machined on the lower side 126 to balance the heat distribution from the embedded heater element 132.

Figure 3:
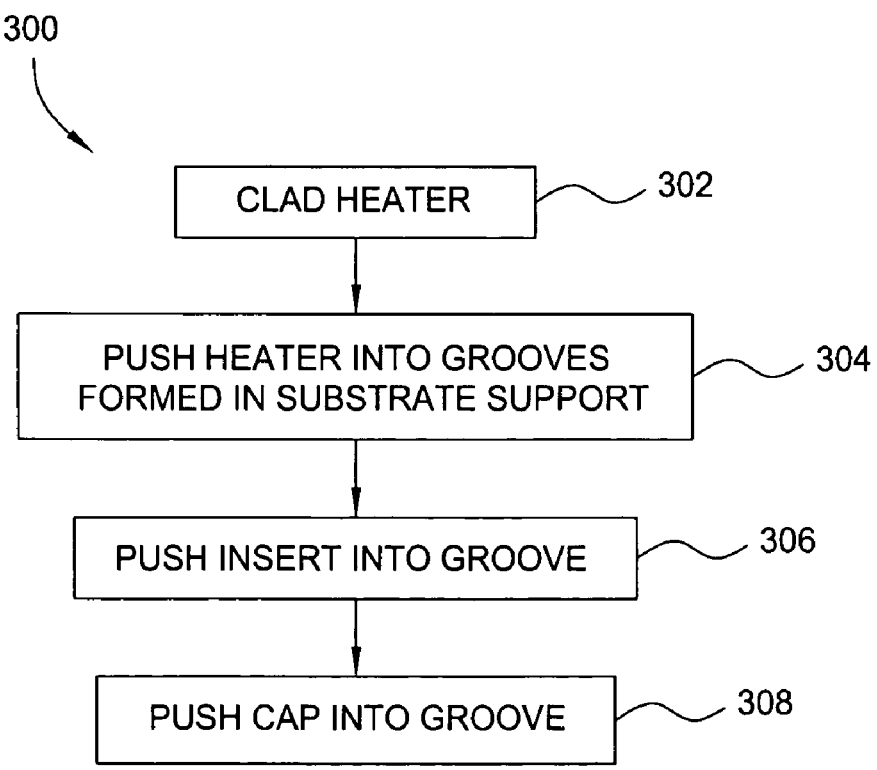
FIG. 3 is a flow chart depicting an inventive method for fabricating a substrate support.
Figure 5:
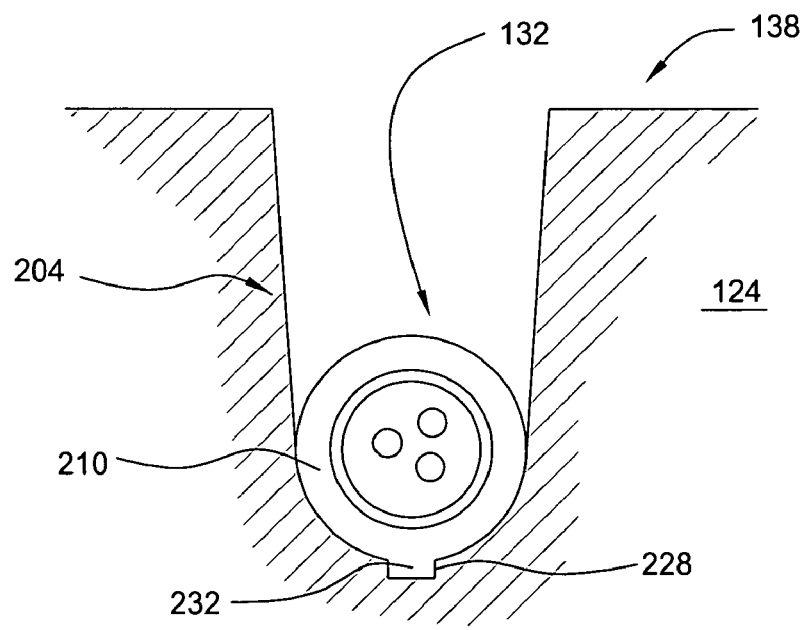

FIG. 3 is a flow chart of one embodiment of a method 300 of fabricating a substrate support assembly as described above. The method depicted in FIG. 3 is further illustrated with reference to FIGS. 4-7. The method 300 includes a step 302, wherein a heater element 132 is encased with a cladding 210. At step 304, the heater element 132 is inserted into a groove 204 formed in the substrate support assembly 138. The heater element 132 may be forced into the groove 204 by, for example, a mechanical or hydraulic press. It is contemplated that other means may be utilized to insert the clad heater element 132 into the groove 204. As shown in FIG. 4, the groove 204 is generally slightly narrower than the diameter of the heating element 132 due to the thickness of the cladding 210. The malleable cladding 210 will deform upon the forced insertion into the groove 204. This advantageously allows for substantially complete contact between the cladding 210 and the groove 204, as shown in FIG. 5. As also depicted in FIG. 5, in one embodiment, a portion 232 of the cladding 210 will be forced into the channel 228 formed in the groove 204.

Next, at step 306, an insert 214 is inserted into the groove 204 to cover the heating element 132, as depicted in FIG. 6. The insert 214 substantially fills the remainder of the groove 204 not occupied by the heating element 132. The insert 214 may generally be press-fit into the groove 204 by the same methods used in step 304 to insert the heater element 132. Upon installation of the insert 214, there may be a net positive force on the heater element 132. As shown in the embodiment depicted in FIG. 6, an upper surface 610 of the insert 214 remains slightly higher than the upper surface 134 of the substrate support assembly 138 at the end of step 306.

Finally, at step 308, a cap 218 (depicted in FIG. 7) is inserted into the groove 204. The cap 218 may be inserted into the groove by the same means used above in steps 304 and 308. The cap 218 compresses the insert 214 to apply a net positive force against the heating element 132. Upon compression of the insert 214, the relieved portion 604 of the insert 214 expands to come into contact with the wall 206 of the groove 204. The amount of relief provided to the upper portion 604 of the insert 214 and the extent to which the upper surface 610 of the insert 214 extends above the upper surface 134 of the substrate support assembly 138 may be calculated based upon the amount of compression and deformation which will occur upon inserting the cap 218 completely into the groove 204 and flush with the upper surface 134 of the substrate support assembly 138. The expansion of the insert 214 should be calculated such that it will fill the groove 204 to insure integral contact between the insert 214 and the wall 206 of the groove 204 while not forcing the groove 204 to open up, widen, or otherwise deform.

The step 308 of inserting the cap 218 into the groove 204 is completed by affixing the cap 218 to the body 124 of the substrate support assembly 138. Optionally, the upper surface 134 of the substrate support assembly and the cap 218 may be machined to improve the upper surface 134 for supporting a substrate thereon.

FIGS. 8A-E depict partial cross-sectional views of another embodiment of a substrate support 800 in different stages of fabrication. The substrate support assembly 800 generally includes a body 830 having at least one groove 802 formed in a support surface 134. A heater element 804 is disposed in the groove 802 to control the temperature of the substrate support assembly 800. The body 830 is generally fabricated from the same materials as the body 124 described above, while the heater 804 is generally fabricated similar to the heater element 132 described above.

The groove 802 generally includes sidewalls 806 and a bottom 814. The sidewalls 806 may be flared outwards from the bottom 814, or formed substantially perpendicular to the support surface 134, as shown in FIGS. 8A-E. A step 808 is formed in the sidewalls 806, separating an upper sidewall portion 812 from a lower sidewall portion 810. The lower sidewall portion 810 generally defines a narrower portion of the groove 802.

A first malleable heat sink 816 is disposed in the groove 802 in contact with the bottom 814. The first malleable heat sink 816 may be fabricated using materials suitable for fabricating the cladding 210 described above. An upper surface of the first malleable heat sink 816 may include a recess 832 formed therein. The recess 832 generally accepts and locates a portion of the heater element 804 within the groove 802.

Figure 8B:
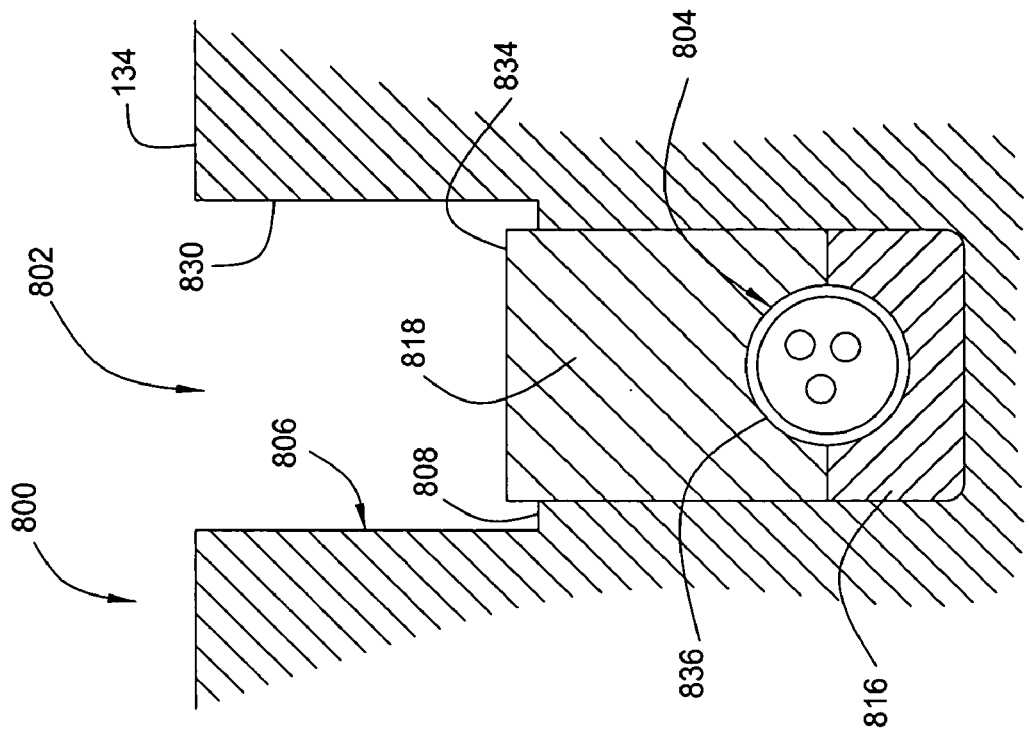
FIGS. 8A-E are partial cross-sectional views of another substrate support in different stages of fabrication.
Figure 8A:
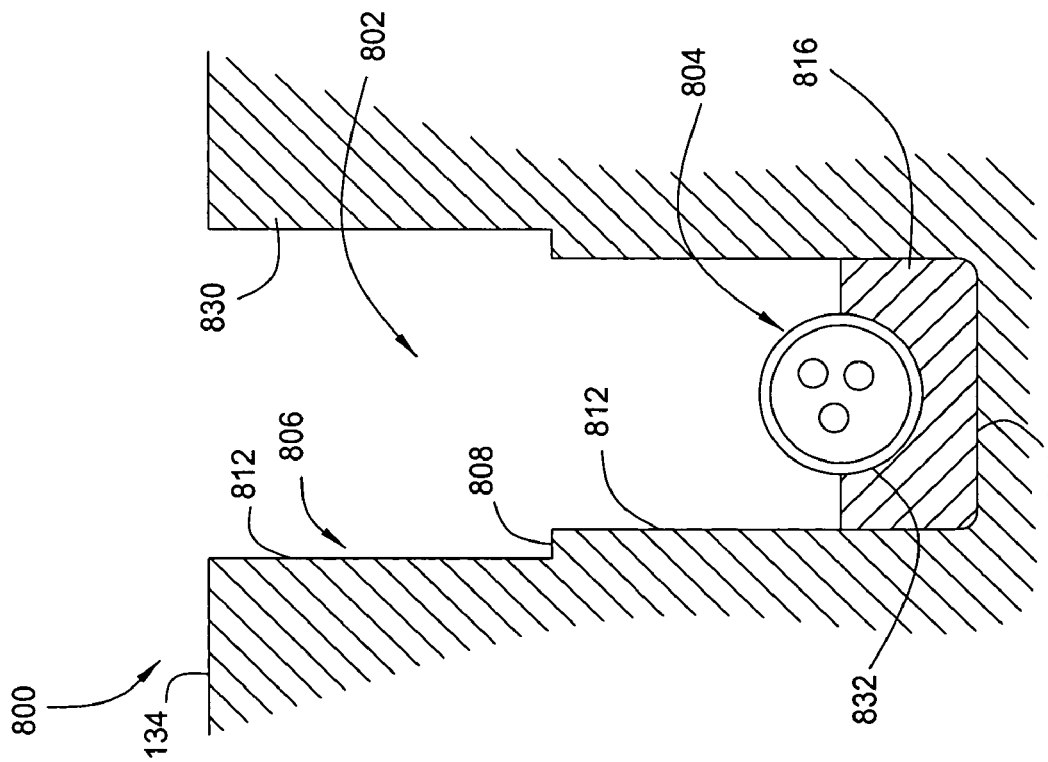
Figure 8D:
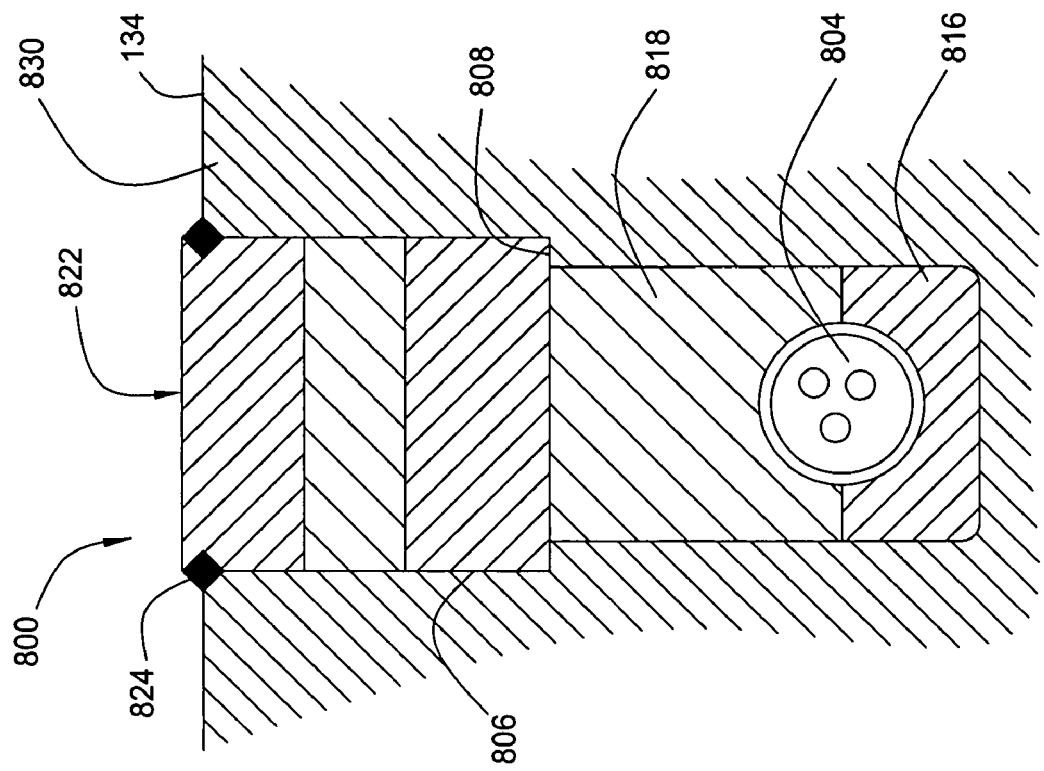

A second malleable heat sink 818 is disposed in the groove 802, and sandwiches the heater element 804 against the first heat sink 816, as shown in FIG. 8B. The second heat sink 818 may be sized to create an interference fit with lower portion of 812 the groove 802. The second heat sink 818 may include a recess 836 formed in its lower surface to accept and located a portion of the heater element 804. The second heat sink 818 may be fabricated from materials suitable for fabricating the cladding 210 described above, and in one embodiment, the first and second heat sinks 816, 818 are fabricated from the same materials. In another example, at least one of the first and second heat sinks 816, 818 may the made from a high purity, super plastic aluminum material, such as aluminum 1100 up to about aluminum 3000-100 series, and may additionally be fully annealed. In another embodiment, the heat sinks 816, 818 may be made from any 1XXX series of materials that easily accepts cold or hot working, where X is an integer. In yet another embodiment, the first and second heat sinks 816, 818 are formed from aluminum 1100-O. The first and second heat sinks 816, 818 generally surround and separate the heater element 804 from the body 830.

Figure 8C:
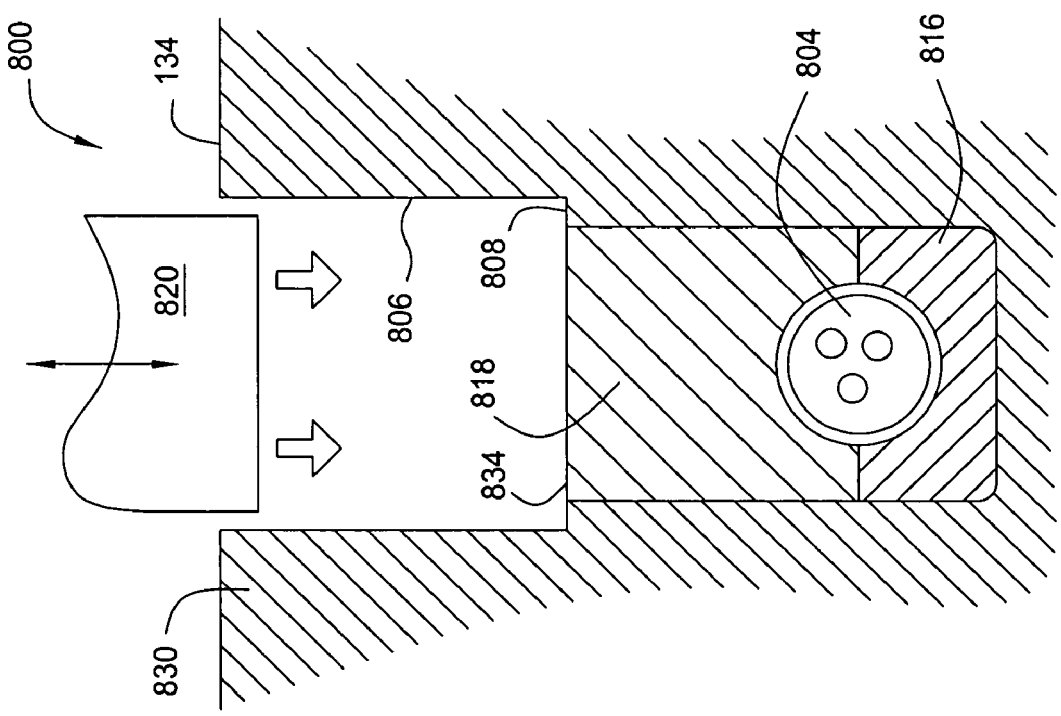
Figure 8E:
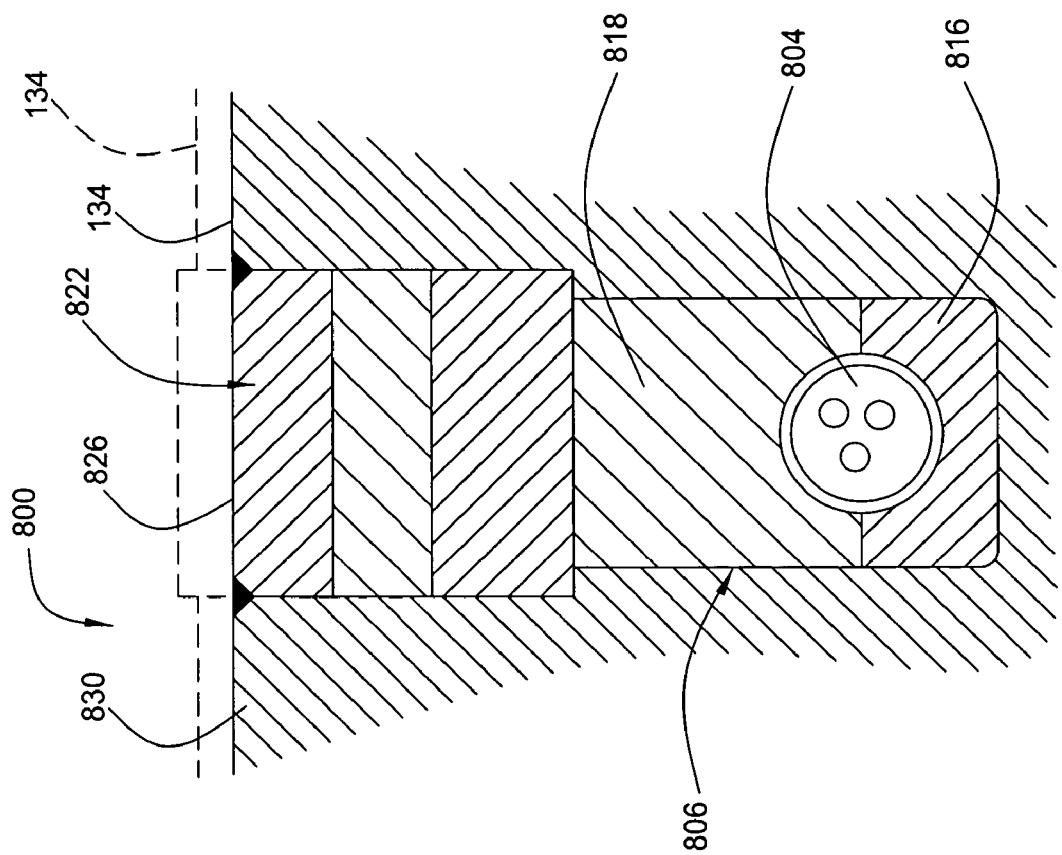

A top surface 834 of the second heat sink 818 generally extends to an elevation above the step 808. As shown in FIG. 8C, a tool 820 may be inserted in the groove 802 to apply pressure to the heat sinks 816, 818. The tool 820 causes the malleable material comprising the heat sinks 816, 818 to deform and make intimate contact with the sidewalls 806 of the body 830 and the heater element 804. The intimate contact caused by the deformation of the heat sinks 816, 818 disrupts the native oxide layers residing on the contacting surfaces, and thus, improves heat transfer the heater element 804 and the body 830. During the deformation process, the top 834 of the upper heat sink 818 second heat sink 818 generally becomes flush with the step 808.

A cap 822 is then inserted in the groove 802, covering the heat sinks 816, 818 and heater element 804. The cap 822 is generally fabricated utilizing one of materials described above suitable for fabricating the cap 218. The cap 822 may be comprised of one or more separate layers of material. In the embodiment depicted in FIG. 8D, the cap 822 is comprised of three layers.

The cap 822 generally seals the heater element 804 in the groove 802, and provides a pressure barrier isolating the heater element 804 from the environment outside the groove 802. In one embodiment, the cap 822 is welded or forged in place. It is also contemplated that the cap 822 may be sealed to the body 830 utilizing other suitable methods. In the embodiment depicted in FIGS. 8D-E, the cap is coupled to the body 830 by a continuous weld 824. After welding, the upper surface 838 of the cap may be machined or otherwise made flush with the upper surface 134 of the body 830. In the embodiment depicted in FIG. 8E, the upper surface 138 of the cap 822 is machined flush with the support surface 134.

FIGS. 9A-E depict partial cross-sectional views of another embodiment of a substrate support 900 in different stages of fabrication. The substrate support assembly 900 generally includes a body 830 having at least one groove 802 formed in a support surface 134. A heater element 804 is disposed in the groove 802 to control the temperature of the substrate support assembly 900.

A first malleable heat sink 916 is disposed in the groove 802 in contact with the bottom 814. The first malleable heat sink 916 is generally fabricated from a material suitable for fabricating the heat sink 816 as described above. The first malleable heat sink 916 generally has a "C"—shaped cross section. In the embodiment depicted in FIGS. 9A-E, the first heat sink 916 includes a main center section 904 and two extending legs 902. Each leg 902 includes a top 906, an inner wall 910 and an outer wall 908. The outer wall 908 is configured to engage the lower portion 812 of the groove 802. The top 906 of the first malleable heat sink 916 may extend above the step 808 formed in the sidewall 806 of the groove 802. A recess 932 may be formed in an upper surface of the center section 904 of the first malleable heat sink 916. The recess 932 generally accepts and locates a portion of the heater element 804 within the groove 802.

A second malleable heat sink 918 is disposed in the groove 802 between the legs 902 of the first malleable heat sink 916, as shown in FIG. 9B. The first and second heat sinks 916, 918 sandwich the heater element 804. The second heat sink 918 may include a recess 936 formed in its lower surface to accept and located a portion of the heater element 804. The second heat sink 918 may be fabricated from materials suitable for fabricating the first heat sink 916 described above, and in one embodiment, the first and second heat sinks 916, 918 are fabricated from the same materials. For example, at least one of the first and second heat sinks 916, 918 may the made from a high purity, super plastic aluminum material, such as aluminum 1100 up to about aluminum 3000-100 series, and may additionally be fully annealed. In another embodiment, the heat sinks 916, 918 may be made from any 1XXX series of materials that easily accepts cold or hot working, where X is an integer. In yet another embodiment, the first and second heat sinks 916, 918 are formed from aluminum 1100-O. The first and second heat sinks 916, 918 generally surround and separate the heater element 804 from the body 830.

A top surface 934 of the second heat sink 918 generally extends to an elevation above the step 808. As shown in FIG. 9C, a tool 820 may be inserted in the groove 802 to apply pressure to the heat sinks 916 and 918. The tool 820 causes the malleable material comprising the heat sinks 916, 918 to deform, and to come into intimate contact with the sidewalls 806 of the body 830 and the heater element 804, thereby improving heat transfer there between the heater element and the body 830. During the deformation process, the tops 906, 934 of the first and second heat sinks 916, 918 generally become flush with the step 808. The insertion of the second heat sink 918 into the groove 802 causes an interaction between the legs 902 of the first heat sink 916 and the body 830 and second heat sink 918 that disrupts native oxide layers residing on the contacting surfaces. The disruption and/or removal of the native oxide layers allow for improved heat transfer between the heater element 804 and the body 803.

A cap 822 is then inserted in the groove 802, covering the heat sinks 916, 918 and heater element 804. The cap 822 may be comprised of one or more separate layers of material, and in the embodiment depicted in FIG. 9D, the cap is comprised of three layers. The cap 822 seals the heater element 804 in the groove 802, and provides a pressure barrier isolating the heater element 804 from the environment outside the groove 802.

Figure 9D:
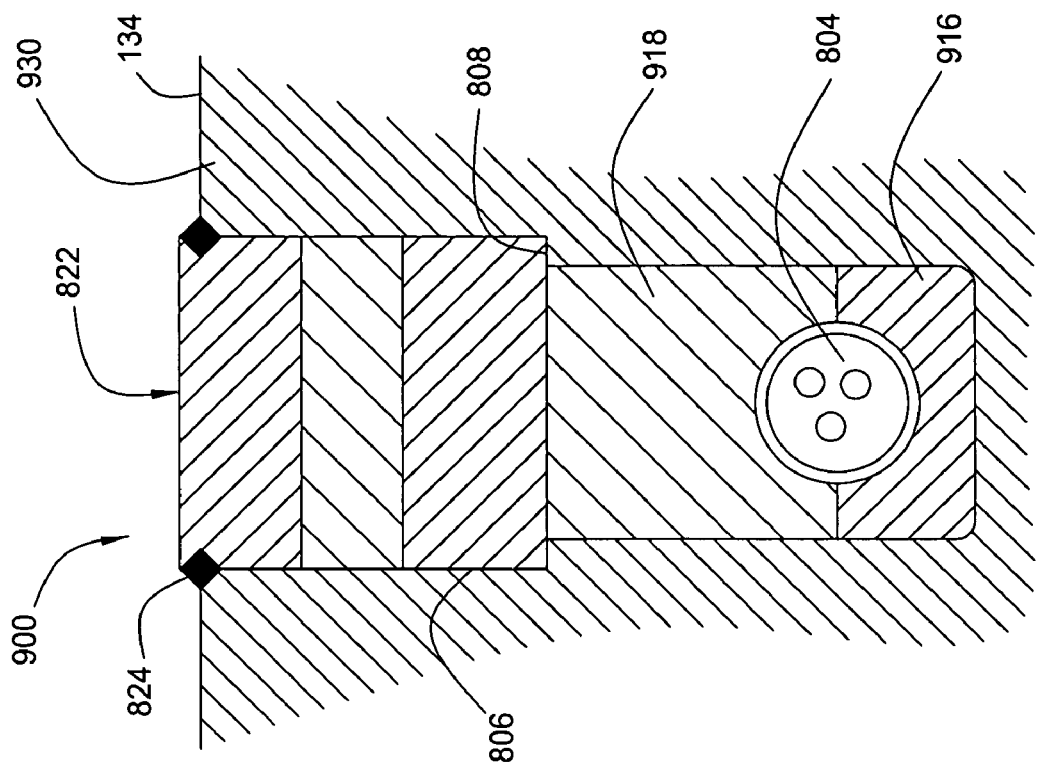
Figure 9C:
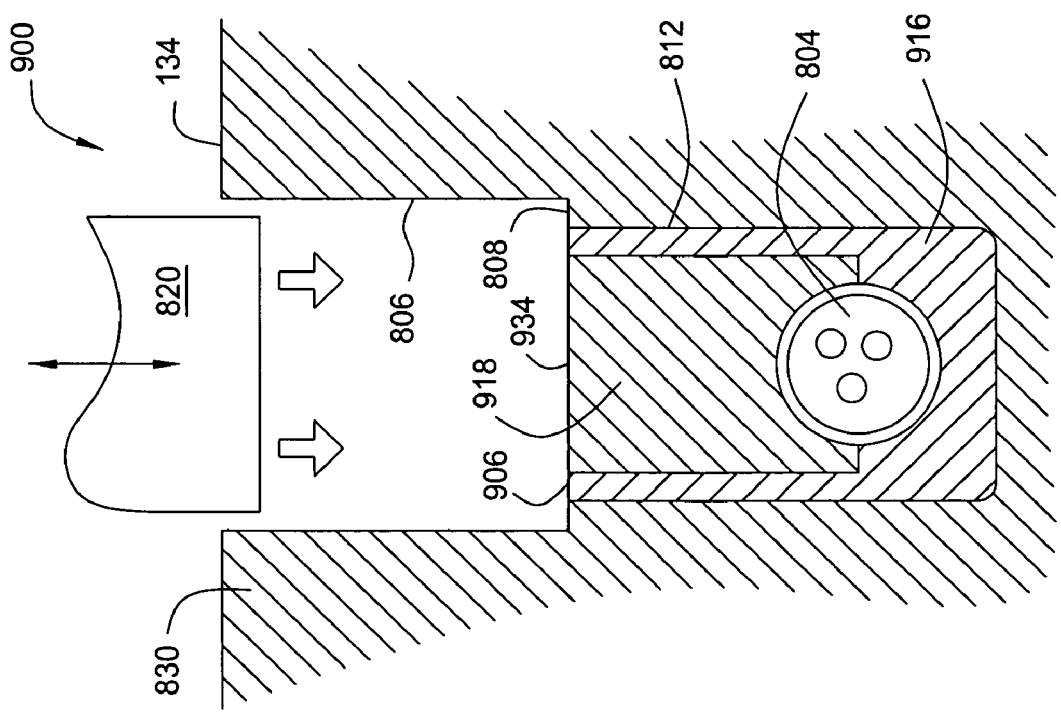
Figure 9E:
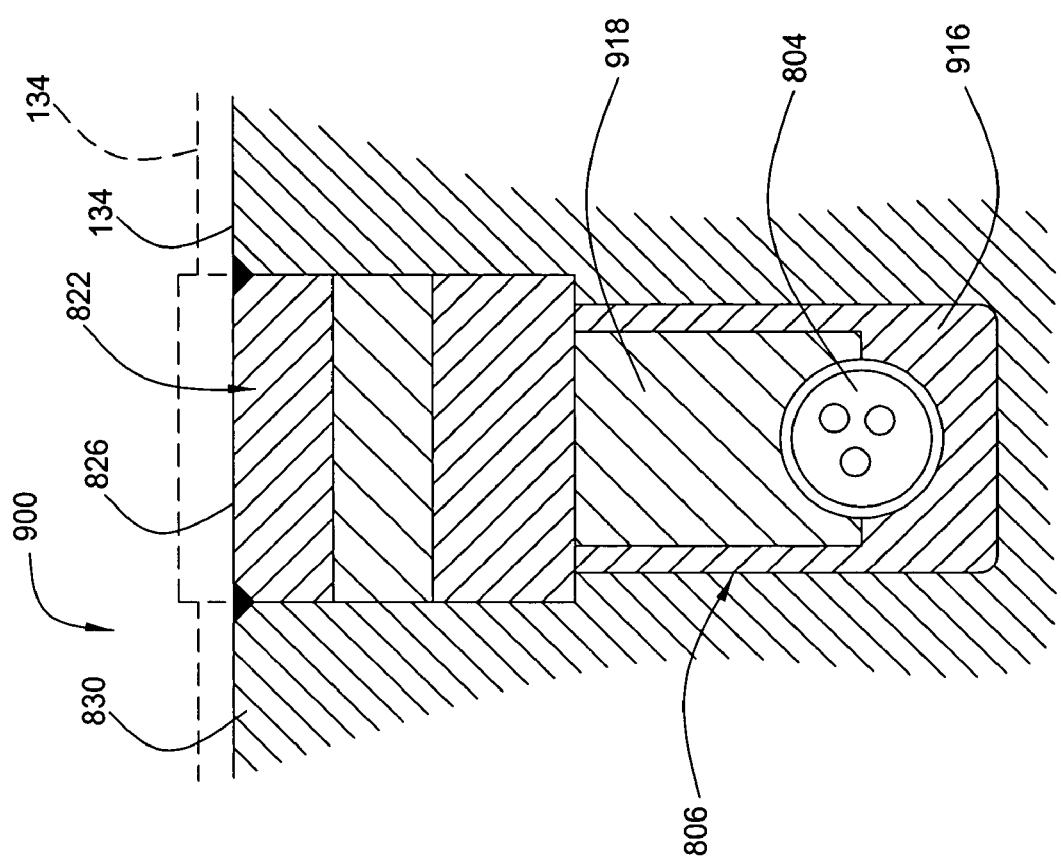

In the embodiment depicted in FIGS. 9D-E, the cap is coupled to the body 830 by a continuous weld 824. After welding, the upper surface 838 of the cap may be machined or otherwise made flush with the upper surface 134 of the body. In the embodiment depicted in FIG. 9E, the upper surface 138 of the cap 822 is machined flush with the support surface 134.

Thus, embodiments of a substrate support assembly are provided having good thermal conductivity between an embedded heater element and a body of the substrate support. As a malleable material it is utilized to make intimate contact between the heater element and the body of the substrate support, close tolerance machining of the groove which houses the heater element is not required, thereby reducing cost of the substrate support assembly while increasing the performance of the heater.

While the foregoing is directed to embodiments of the present invention, other and further embodiments of the invention may be devised without departing from the basic scope thereof, and the scope thereof is determined by the claims that follow.

The invention claimed is:

1. A substrate support, comprising:
   an aluminum body having a planar support surface configured to support a substrate thereon;
   at least one groove formed in the support surface of the body, wherein at least one wall of the groove has a step formed therein;
   a first malleable heat sink disposed within the groove;
   a heater element disposed within the groove and in contact with the first heat sink;
   a second malleable heat sink disposed in the groove and in contact with the first heat sink and the heater element; and
   a cap member disposed in the groove, wherein the cap member has a lower surface in contact with the at least one step and an upper surface coplanar with the planar support surface.

2. The substrate support of claim 1, wherein the lower surface of the cap member is in contact with the second malleable heat sink.

3. The substrate support of claim 2, wherein the cap member is comprised of multiple layers of material.

4. The substrate support of claim 2, wherein the cap member is comprised of three layers of material.

5. The substrate support of claim 2, wherein the body is anodized.

6. The substrate support of claim 2, wherein the support surface has a plan area equal to or greater than about 0.35 square meters.

7. The substrate support of claim 2, wherein the support surface has a plan area equal to or greater than about 2.7 square meters.

8. The substrate support of claim 2, wherein the body has a plurality of apertures formed therethrough.

9. The substrate support of claim 2, wherein the cap member is attached to the body via a continuous weld.

10. A substrate support, comprising:
    an aluminum body having a planar support surface configured to support a substrate thereon;
    at least one groove formed in the support surface of the body, wherein at least one wall of the groove has a step formed therein;

a first malleable heat sink disposed within the groove;

a heater element disposed within the groove and in contact with the first heat sink, wherein the heater element comprises a conductive element that is encased in a dielectric material and surrounded by a sheath;

a second malleable heat sink disposed in the groove and in contact with the first heat sink and the heater element; and a cap member disposed in the groove, wherein the cap member has a lower surface in contact with the at least one step and an upper surface coplanar with the planar support surface.

11. The substrate support of claim 10, wherein the cap member is comprised of multiple layers of material.

12. The substrate support of claim 11, wherein the cap member is attached to the body via a continuous weld.

13. The substrate support of claim 12, wherein the body has a plurality of apertures formed therethrough.

14. The substrate support of claim 13, wherein the support surface has a plan area equal to or greater than about 0.35 square meters.

15. The substrate support of claim 13, wherein the support surface has a plan area equal to or greater than about 2.7 square meters.

16. A substrate support, comprising:

an aluminum body having a planar support surface configured to support a substrate thereon, wherein the support surface has a plan area greater than about 0.35 square meters;

at least one groove formed in the support surface of the body, wherein at least one wall of the groove has a step formed therein;

a first malleable heat sink disposed within the groove;

a heater element disposed within the groove and in contact with the first heat sink;

a second malleable heat sink disposed in the groove and in contact with the first heat sink and the heater element; and a cap member disposed in the groove, wherein the cap member has a lower surface in contact with the at least one step and an upper surface coplanar with the planar support surface, and wherein the cap member is comprised of multiple layers of material.

17. The substrate support of claim 16, wherein the cap member is attached to the body via a continuous weld.

18. The substrate support of claim 17, wherein the body has a plurality of apertures formed therethrough.

19. The substrate support of claim 18, wherein the support surface is sized to hold a substrate having a size at least about 1500 mm by about 1800 mm.

* * * * *